United States Patent
Credendino et al.

(10) Patent No.: US 6,436,595 B1
(45) Date of Patent: Aug. 20, 2002

(54) METHOD OF ALIGNING LITHOGRAPHICALLY PRINTED PRODUCT LAYERS USING NON-ZERO OVERLAY TARGETS

(75) Inventors: Santo Credendino, Poughkeepsie; Timothy J. Wiltshire, Fishkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/779,421

(22) Filed: Feb. 8, 2001

(51) Int. Cl.[7] .................................................. G03F 9/00
(52) U.S. Cl. ........................................... 430/22; 430/30
(58) Field of Search ..................... 430/22, 30

(56) References Cited

U.S. PATENT DOCUMENTS

| | | | |
|---|---|---|---|
| 4,833,621 A | 5/1989 | Umatate | 364/491 |
| 4,938,600 A | 7/1990 | Into | 356/401 |
| 5,280,437 A | 1/1994 | Corliss | 364/559 |
| 5,498,500 A | 3/1996 | Bae | 430/22 |
| 5,635,336 A | 6/1997 | Bae | 430/314 |
| 5,701,013 A | 12/1997 | Hsia et al. | 250/491 |
| 5,770,338 A | 6/1998 | Lim et al. | 430/22 |
| 5,952,132 A | 9/1999 | King et al. | 430/22 |
| 6,022,650 A | 2/2000 | Sogawa | 430/22 |

FOREIGN PATENT DOCUMENTS

JP 5136021 6/1993

*Primary Examiner*—Christopher G. Young
(74) *Attorney, Agent, or Firm*—Margaret A. Pepper

(57) ABSTRACT

The present invention relates generally to the field of semiconductor device manufacturing, and more specifically to a method for aligning a projected photolithography mask pattern image with respect to the underlying device layer. The method involves measuring the overlay error between product features in the projected layer and product features in the underlying layer, determining an adjustment factor based on these measurements, and applying this adjustment factor to the overlay error between reference features located in the kerf of the projected layer and reference features in the kerf of the underlying layer. Thus, nonzero offsets or adjustment factors for box-in-box overlay targets are entered into a stepper or scanner tool, in order to minimize within field product overlay errors.

14 Claims, 23 Drawing Sheets

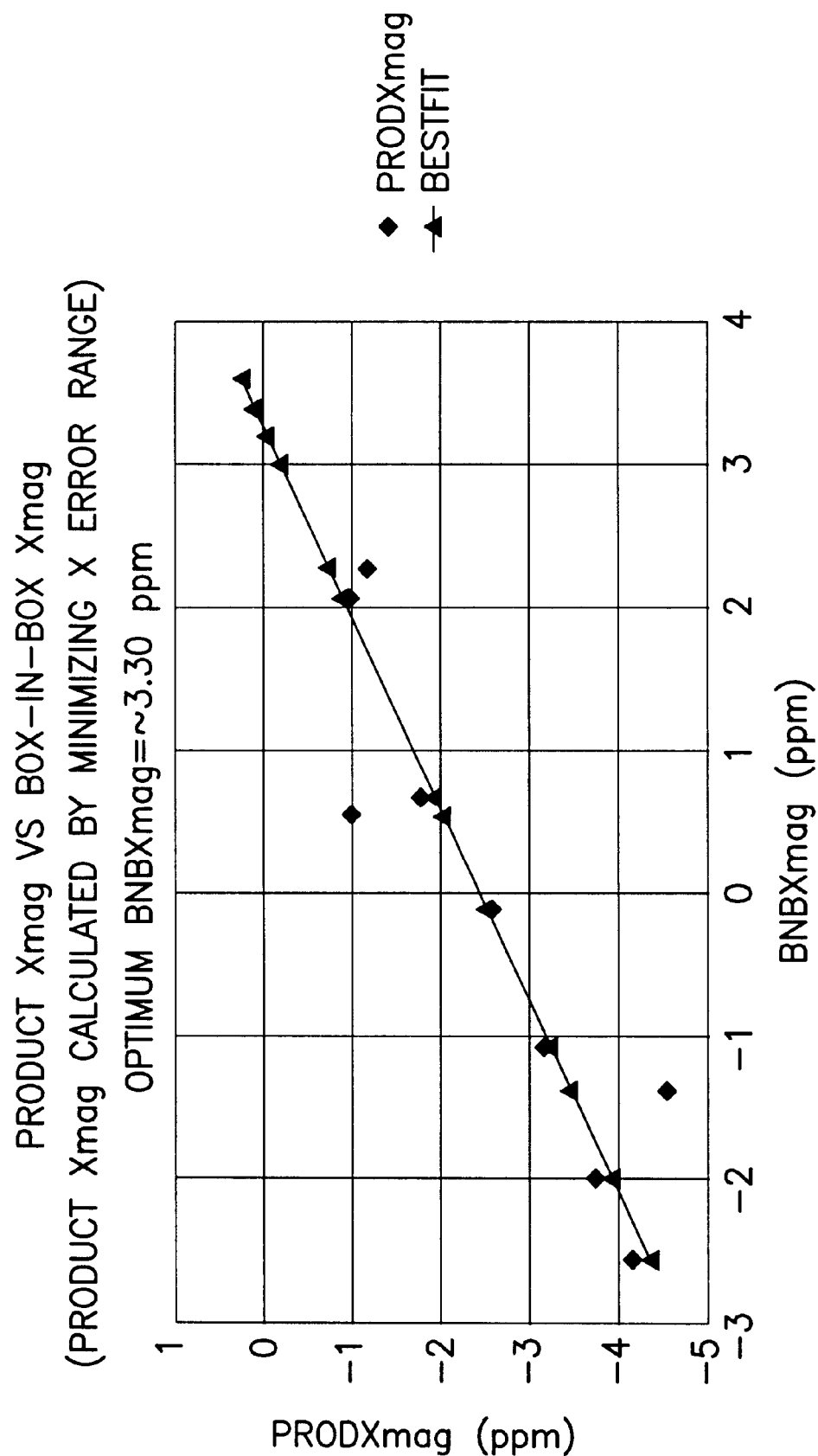

| FIG.7A-1 | FIG.7A-2 |
| --- | --- |
| FIG.7A-3 | FIG.7A-4 |
| FIG.7A-5 | FIG.7A-6 |

| FIG.7B-1 | FIG.7B-2 |
| --- | --- |
| FIG.7B-3 | FIG.7B-4 |
| FIG.7B-5 | FIG.7B-6 |

METHOD OF ALIGNING LITHOGRAPHICALLY PRINTED PRODUCT LAYERS USING NON-ZERO OVERLAY TARGETS

FIELD OF THE INVENTION

The present invention relates generally to the field of semiconductor device manufacturing, and more specifically to a method for aligning a projected photolithography mask pattern image with respect to the underlying device layer.

BACKGROUND OF THE INVENTION

The manufacture of complex semiconductor devices involves printing multiple layers of device features onto a substrate using photolithography printing techniques. To achieve proper electrical contact between the different layers or levels of device features, each layer must be accurately aligned with the previous underlying layer. Misalignment of a layer of device features with respect to the previous underlying layer may result in unintended opens or shorts between device features on different levels, causing loss of the entire product.

Alignment of layers of device features has conventionally been achieved through the use of overlay targets, typically box-in-box targets, located in the kerf surrounding the outer edge of a chip product area on a semiconductor wafer. FIG. 1A shows a schematic view of a chip product area 100 on a semiconductor wafer. The chip product area is also referred to as the product "field" on the wafer. Box-in-box overlay targets 111–114 are located in the kerf surrounding product field 100. Typically, four box-in-box overlay targets are positioned as shown. The relative position of notch 120 on the semiconductor wafer is also shown.

Photolithography printing involves the deposition of a layer of photosensitive material on a semiconductor substrate, exposure of the photosensitive material through a mask, and development of the exposed photosensitive layer. Exposure is typically carried out in a scanner or stepper tool, wherein an exposure slit is passed across the surface of the substrate, thereby sequentially exposing narrow strips of the photosensitive layer. FIG. 1A schematically shows scanner exposure slit 130, and the direction of its movement relative to product field 100, box-in-box targets 111–114, and notch 120.

Product field 100 may comprise many device features, some of which are shown schematically in FIG 1B. For example, a lower layer may comprise connectors 101, and an upper layer may comprise line 102. Features 101 may be referred to as Level 1 features, and feature 102 may be referred to as a Level 2 feature. Proper alignment of the projected Level 2 photolithography mask image relative to the underlying Level 1 is critical. If line 102 is positioned too far to the right or left in the x direction, this feature may overlie the wrong contacts 101. If line 102 is positioned too far up or down in the y direction, this feature may not touch one of the intended contacts 101. A small amount of alignment error can be tolerated, depending on the relative size of the features to be printed. This amount of tolerable alignment error may be referred to as the overlay budget. However, as typical device feature sizes continue to shrink, errors in alignment of these layers must be reduced accordingly.

As stated previously, a layer to be printed on a semiconductor substrate has conventionally been aligned with the previously printed layer through the use of box-in-box targets, such as targets 111–114 shown in FIG. 1A. The larger box is typically printed in the kerf of the underlying layer, and the smaller box is associated with the next layer to be printed. The center of the smaller box is aligned such that it directly overlays the center of the larger box. In other words, the overlay error or offset between the center of each smaller (target) box and the center of the corresponding larger box is driven to zero. Once each box-in-box target is properly aligned, it is assumed that the device features within the product field will also be properly aligned.

However, it has been observed that significant overlay errors can occur within the product field even when the box-in-box target overlay error is driven to zero. This phenomenon may be the result of lens aberrations (e.g., distortions and coma induced pattern displacements) and other tool anomalies that cause features within the product field to be misaligned. In particular, exposing different product layers using different tools with mismatched lens distortion patterns can often result in significant within field overlay registration errors. Similarly, exposing different product layers using the same tool, but using different lens illumination conditions, can also lead to significant within field overlay registration errors. Therefore, overlay error measured at the box-in-box targets is not a true indication of the overlay error within the product field.

This problem of overlay error due to lens aberrations and other causes exists with virtually all exposure tools. Tools having similar lens distortion patterns could be used together in the manufacture of semiconductor chips, thereby reducing the tool-to-tool overlay error, and tools whose lens distortion patterns are grossly mismatched could be avoided. Likewise, changes in lens illumination conditions within a single tool between exposure of successive product layers could be avoided. Alternatively, different tools could be dedicated for critical product layers or levels.

However, all of these techniques suffer from the disadvantage of reduced flexibility in manufacturing tool usage. Using tools only in matched pairs reduces flexibility in that when one tool is down for servicing or maintenance, the other tool is therefore not usable. Similarly, avoiding changes in lens illumination conditions within a single tool limits flexibility in the performance of tool servicing or maintenance. Finally, dedicating particular tools for critical product layers or levels would require a different tool for each successive exposure, resulting in a prohibitively large and expensive manufacturing facility.

Therefore, there is a need in the art for a method of aligning two or more product layers, wherein the method does not rely on the assumption that minimizing overlay error in the box-in-box targets results in minimized overlay error within the product field.

In addition, there is a need in the art for a method of optimizing the alignment of two or more product layers, wherein the method does not require that the lens distortion signatures used in successive exposures be matched.

SUMMARY OF THE INVENTION

The present invention eliminates the aforementioned problems by measuring the overlay error of product features within the product field, determining an adjustment factor based on this overlay error, and applying the adjustment factor to the box-in-box targets to obtain nonzero box-in-box target offsets and to minimize within field overlay error.

A method for aligning a projected image of a photolithography mask pattern for a second product layer with respect to a first product layer is disclosed. The first product layer includes a periphery surrounding a first product area, the mask pattern for the second product layer includes a periphery surrounding a second product area, the first product area includes at least one first product feature, and the second product area includes at least one second product feature. The method comprises the steps of: (a) providing at least one first reference feature in the periphery of the first layer; (b) providing at least one second reference feature in the periphery of the mask pattern for the second product layer; (c) measuring a first overlay error between the at least one first reference feature and the projected image of the at least one second reference feature; (d) measuring a second overlay error between the at least one first product feature and the projected image of the at least one second product feature; (e) determining at least one adjustment factor to be applied to the first overlay error between said reference features, such that said adjustment factor minimizes the second overlay error between said product features; and (f) applying said at least one adjustment factor to the first overlay error between said reference features.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

FIG. 6C is a plot of product X mag versus box-in-box X mag, with a least squares regression analysis line drawn through the data points;

DETAILED DESCRIPTION OF THE PREFERRED EMBODIMENTS

Figure 1A:
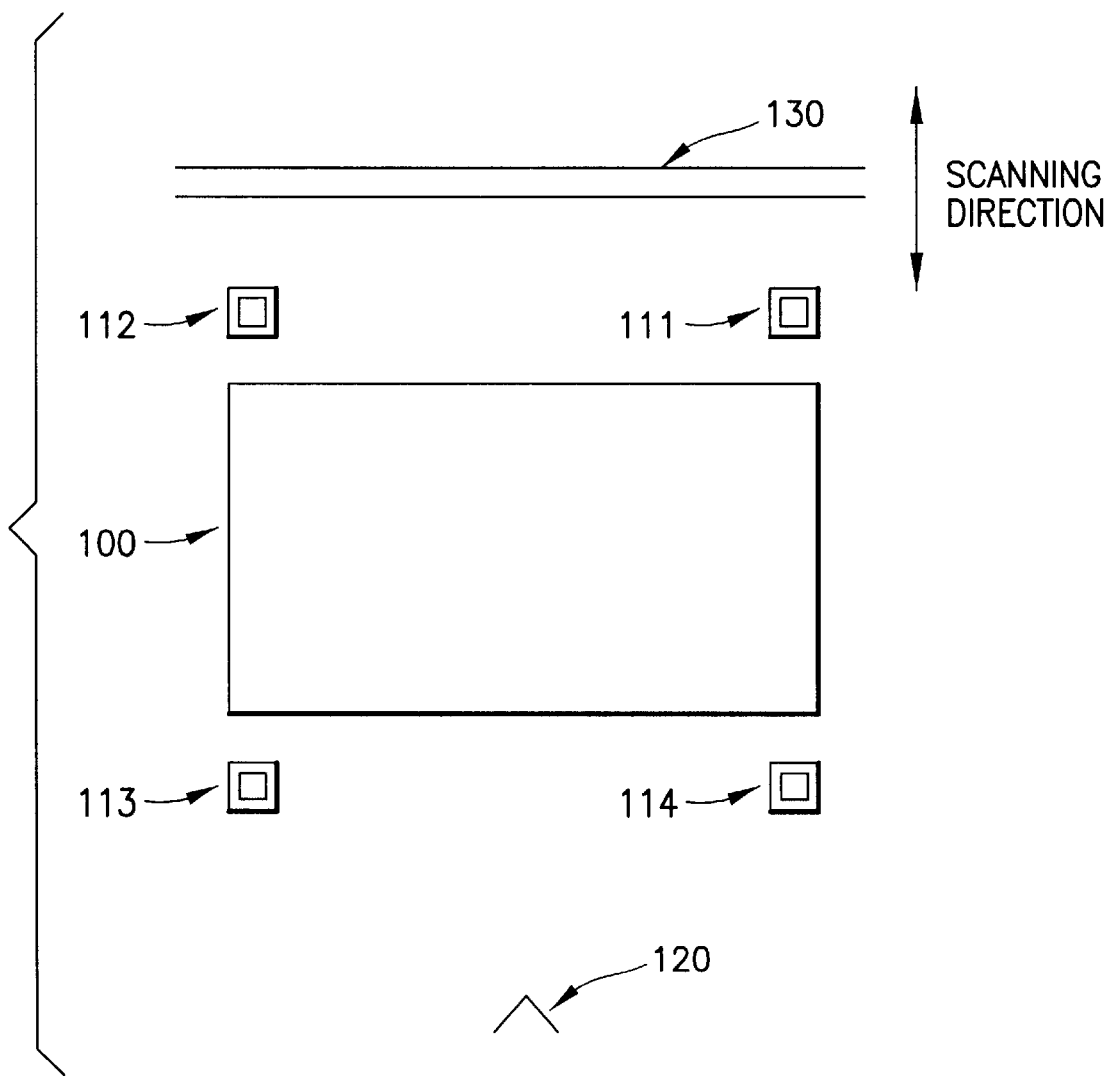
FIG. 1A is a schematic view of a product chip area or product field on a semiconductor wafer.

In accordance with the method for aligning two product layers of the present invention, a preferred embodiment first involves providing at least one reference feature in the periphery of the first layer, and at least one reference feature in the periphery of the mask pattern for the second product layer. These reference features may be of any suitable size or shape. Typically, these reference features have a square shape, such that reference features in the first layer and in the projected image of the second layer form a box-in-box target.

The method next involves measuring a first overlay error between the reference features in the first layer and in the projected image of the second layer. Overlay error may be expressed in any form, including translation, magnification, rotation, skew, and other systematic or residual displacement errors, and any combination thereof.

For example, in a box-in-box target, if the center of the inner box is projected at a point 10 nm to the right of the center of the outer box, then the overlay error is an x-axis translation error, and its magnitude is +10 nm. Similarly, if the center of the inner box is projected at a point 8 nm below the center of the outer box, then the overlay error is a y-axis translation error, and its magnitude is −8 nm.

Overlay error may also be expressed as a magnification error. If the desired reference feature is a square having sides of 20 mm, but the projected image of the reference feature is a rectangle having horizontal sides of 20 mm plus 8 nm and vertical sides of 20 mm, then the overlay error is an x-axis magnification error. The magnitude of the overlay error is 8 nm/20 mm, or 0.4 nm/mm. The units nm/mm can be expressed as ppm.

Overlay error may also be expressed as a rotation error. If the desired reference feature is a square aligned with a horizontal side along an x-axis and a vertical side along a y-axis, but the projected image of the square has its sides rotated 10° off the axes, then the overlay error is a rotation error and its magnitude is 10°.

Next, a second overlay error between product features in the product field on the two layers is measured. Again, the overlay error between product features may be expressed in any form, including translation, magnification, rotation, skew, and other systematic or residual displacement errors, and any combination thereof.

Finally, an adjustment factor is determined, and this adjustment factor is applied to the first overlay error between the reference features. The adjustment factor is based on the measured second overlay error between the product features, and should be chosen such that application of the adjustment factor to both the product feature overlay error and the reference feature overlay error results in minimization of the overlay error between product features.

For example, if the overlay error between reference features is a translation error with a magnitude of +1 nm, and the corresponding overlay error between product features is a translation error with a magnitude of −2 nm, the adjustment factor required in order to minimize the product overlay error would be +2 nm. Thus, if this adjustment factor were added to the overlay error between product features, the product overlay error would be driven to zero; and if this adjustment factor were added to the overlay error between reference features, the adjusted reference overlay error would be +3 nm. The exposure tool overlay settings should therefore be adjusted such that the target overlay offset between reference features (e.g., box-in-box target) is +3 nm, rather than the typical zero offset.

Optionally, the exposure tool overlay settings may be initially adjusted such that the overlay error between reference features on different layers is minimized. Of course, in prior art methods, when the overlay error between the reference features was minimized, it was assumed that the overlay error between the product features was similarly minimized. However, in the method disclosed herein, no such assumption is made. In the disclosed method, initially minimizing the overlay error between reference features merely serves to simplify later application of the adjustment factor.

Optionally, a plurality of overlay errors between product features may be measured, and a representative overlay error may be calculated. For example, a plurality of translation overlay errors may be measured, and an average of these overlay errors may be calculated. In this case, the adjustment factor would be the negative of this average.

Alternatively, for more complex overlay errors involving, for example, both translation and magnification error, an array of overlay error data may be collected and analyzed as follows. First, a predetermined offset may be applied to the overlay error between reference features, and the corresponding overlay error between product features is measured. If a plurality of overlay errors between product features is measured, then an average of these overlay errors may be calculated. Next, a second predetermined offset may be applied to the overlay error between reference features, and the corresponding overlay error between product features is again measured. This process is repeated until an array of reference overlay error versus product overlay error is obtained. If the overlay error offsets and measurements comprise various x-axis and y-axis components, and various translation and magnification components, separate arrays of overlay error data are compiled for each component. A least squares regression, or other error residual minimization or general regression technique, may then be performed on each data set, in order determine the optimum predetermined offset which results in a minimum product overlay error. This optimum offset is then applied as the adjustment factor to the overlay error between reference features.

EXAMPLE 1

In this experiment, the overlay registration error was measured for two step and scan lithography tools having different lens illumination conditions. The overlay registration error was measured using the tools' own metrology subsystem which involves an image projected onto a reference signal detector. Therefore, the data obtained in this experiment shows the overlay registration error within the tool without reference to any product in the tool. The illumination conditions employed in each tool were as follows: in Tool A, annular illumination was used, and Tool B employed conventional illumination. For Tool A, the overlay error was measured twice: once prior to changing a projection optics lens element, and once after changing the lens element.

Figure 1B:
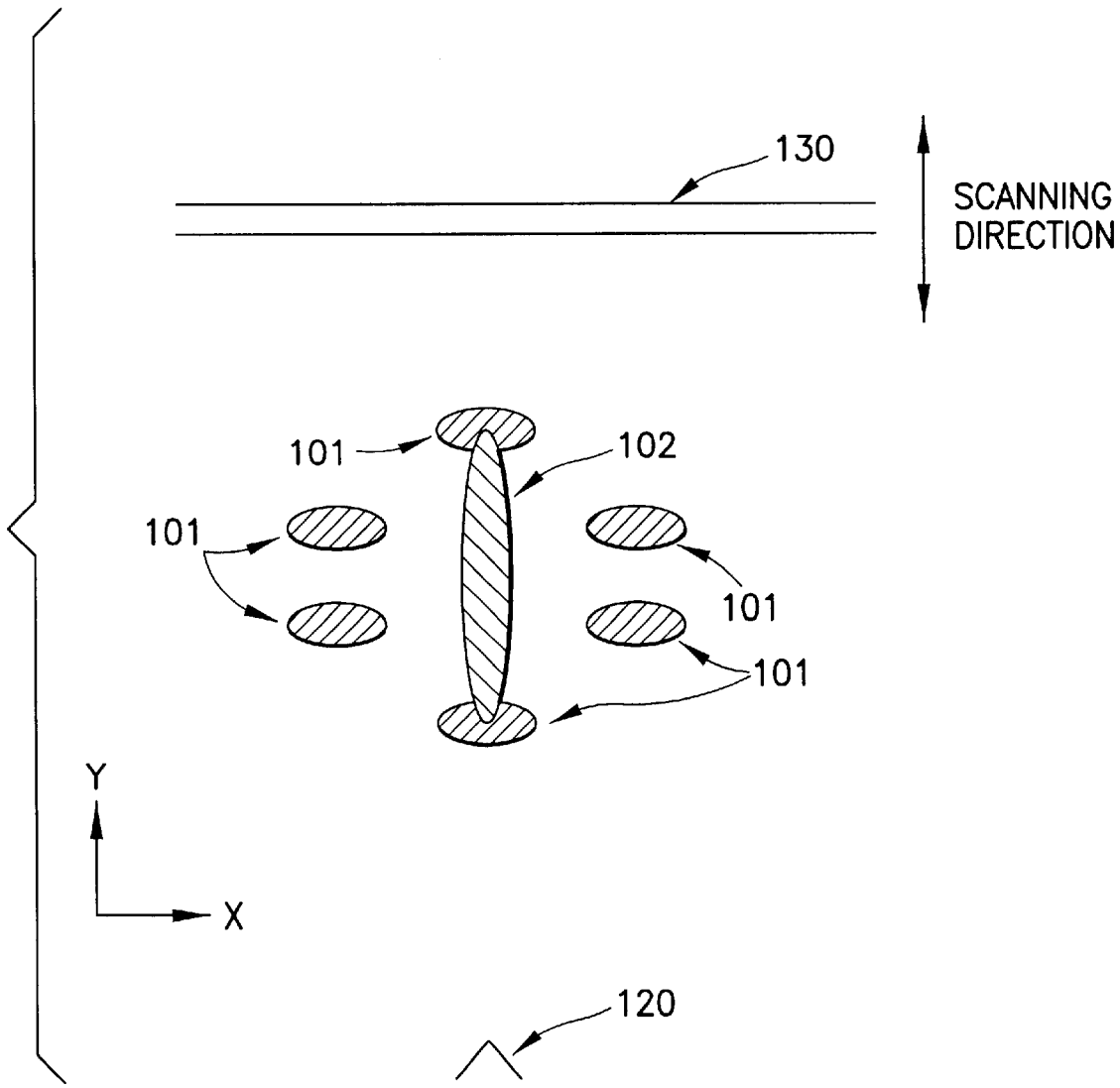
FIG. 1B is a schematic view of a portion of the product chip area or product field of FIG. 1A.
Figure 2A:
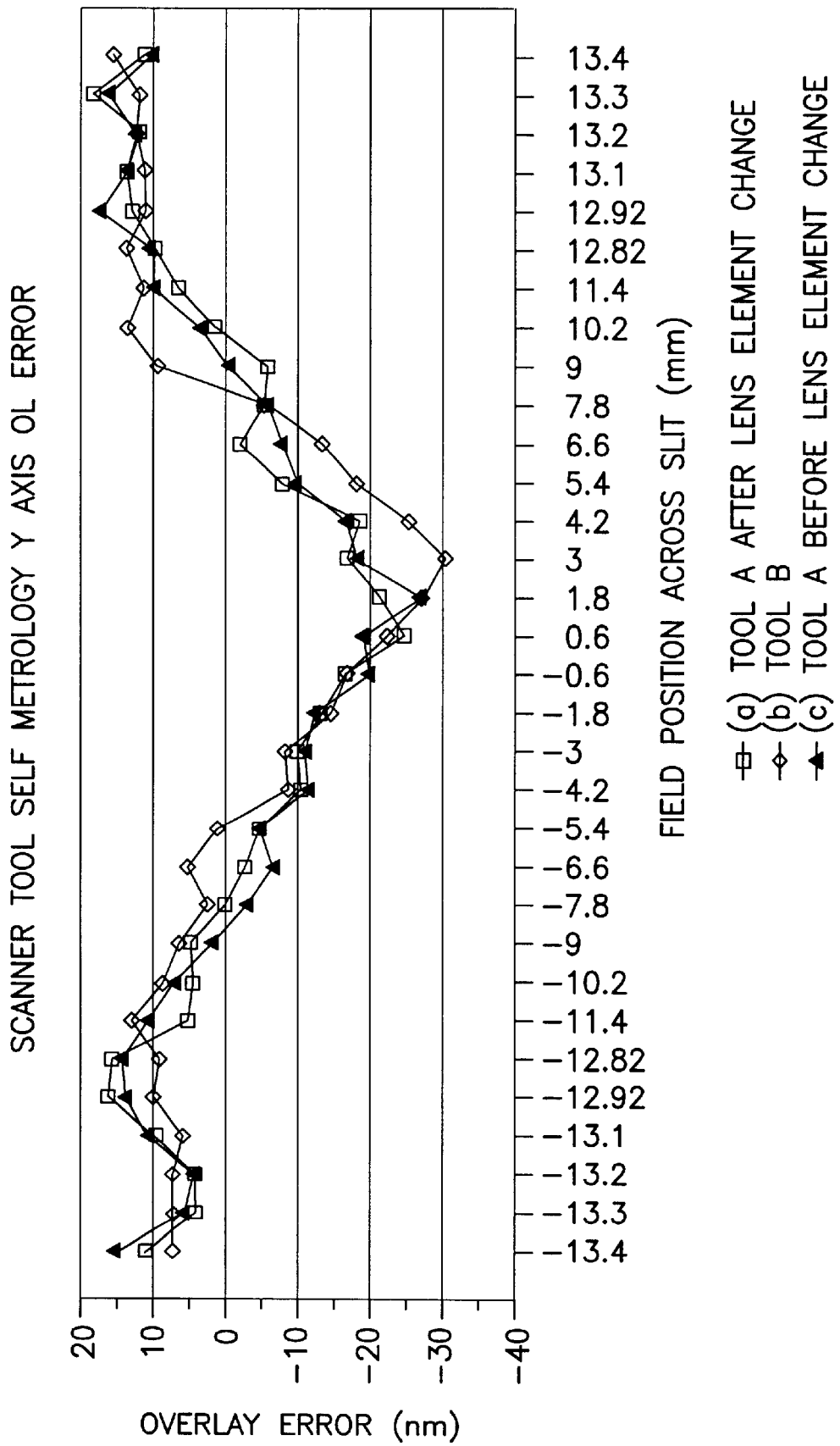
FIG. 2A is a graph of y-axis overlay error as a function of field position across the exposure slit, measured using the self metrology subsystem on two stepper tools with three different lens illumination conditions.
Figure 2B:
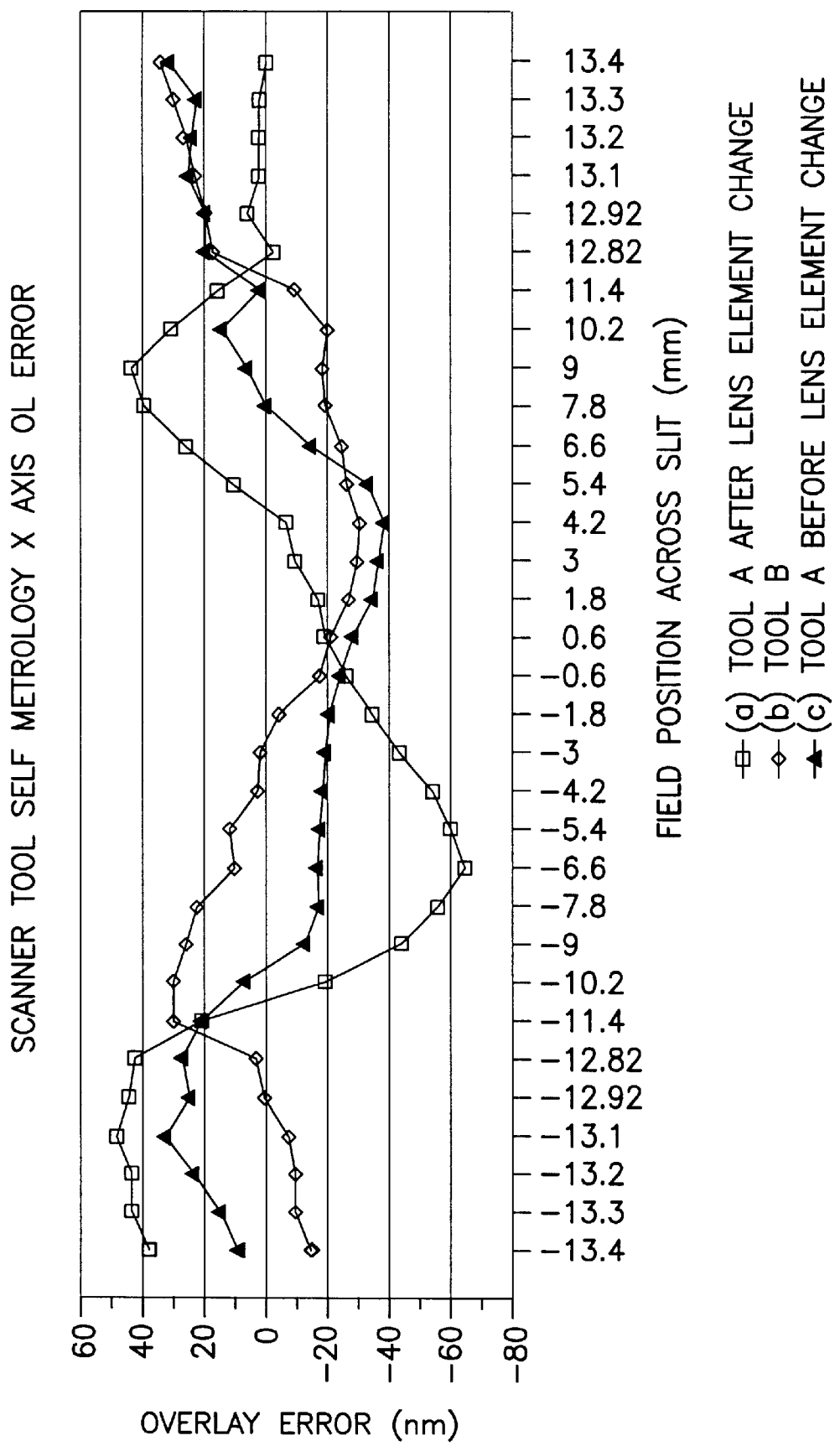
FIG. 2B is a graph of x-axis overlay error as a function of field position across the exposure slit, measured using the self metrology subsystem on two stepper tools with three different lens illumination conditions.

FIGS. 2A and 2B show plots of the overlay error as a function of the field position across the scanner exposure slit for (a) Tool A after lens element change, (b) Tool B, and (c) Tool A prior to lens element change. FIG. 2A shows the y-axis overlay error, and FIG. 2B shows the x-axis overlay error. The orientation of the metrology axes relative to exposure slit orientation, scanning direction and notch location is shown in FIG. 1B.

The y-axis overlay error is shown in FIG. 2A for (a) Tool A after lens element change, (b) Tool B, and (c) Tool A prior to lens element change. FIG. 2A demonstrates that there is very little change in the overlay error signature in the y direction for different illumination conditions from Tool A to Tool B, and within Tool A before and after the lens element change.

The x-axis overlay error is shown in FIG. 2B for (a) Tool A after lens element change, (b) Tool B, and (c) Tool A prior to lens element change. In contrast to FIG. 2A, FIG. 2B shows that there is a significant change in the characteristic overlay curve in the x direction for different illumination conditions from Tool A to Tool B, and within Tool A before and after the lens element change. Product exposed on Tool A before and after the lens element change would have a within field registration error of as high as 45 nm. Product exposed on Tool B after exposure on Tool A would see a registration error of as high as 75 nm. These registration errors would be close to or would exceed the entire overlay budget for many of today's microelectronics products.

EXAMPLE 2

The purpose of this experiment was to determine whether the effect of the x-axis sinusoid overlay error curve for Tool A after lens element change (curve (a) in FIG. 2B) could be modulated by changing the exposure tool overlay settings. As discussed above, product exposed on Tool A before and after the lens element change would have a within field registration error of as much as 45 nm. The entire overlay error budget for a typical product running on this tool is 60 nm, which must include not only the overlay error swing shown in curve (a) of FIG. 2B, but also other translation, rotation and skew errors. Therefore, it would be advantageous to minimize the range of overlay registration error by flattening curve (a) of FIG. 2B, and translating the curve closer to zero overlay error.

Figure 3:
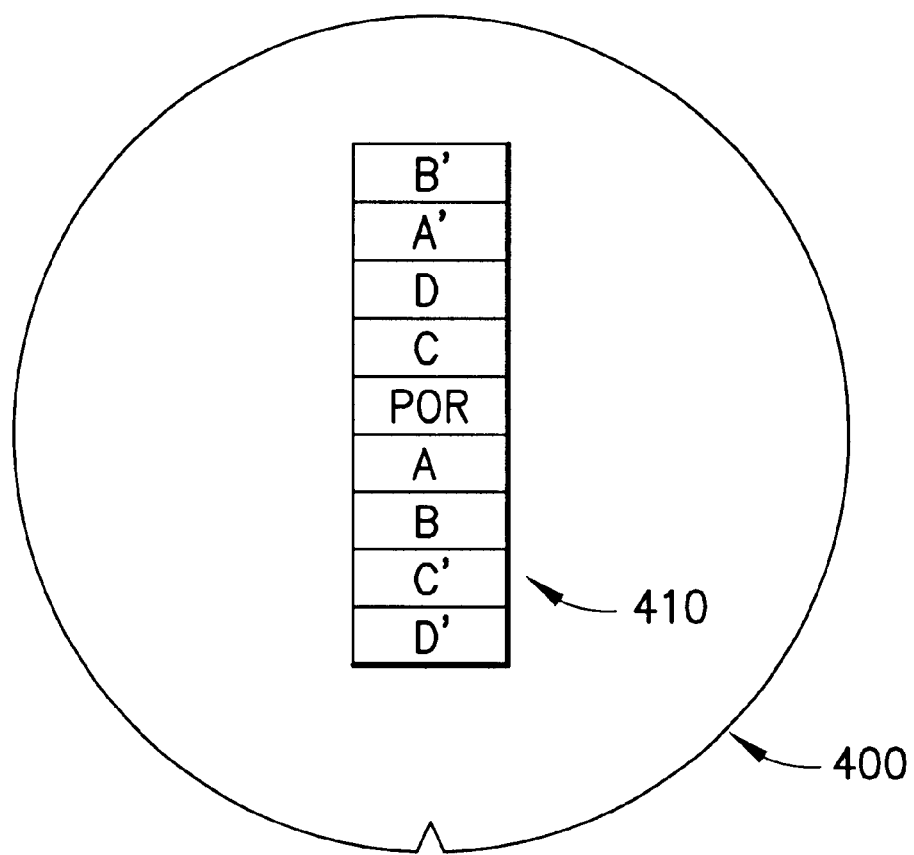
FIG. 3 is a schematic view of a semiconductor test wafer containing nine test cells.

FIG. 3 shows a schematic view of a test wafer 400 having test cells 410. The test cells are labeled B', A', D, C, POR (process of record), A, B, C', and D'. These nine test cells differed in that they were exposed with different exposure tool overlay settings for x translation offset (X offset), x magnification (X mag), and y magnification (Mag). These offset and magnification conditions, listed below in Table 1, were chosen based on the expected range of offset and magnification errors in a typical product field.

TABLE 1

Exposure Tool Offset and Magnification Conditions for Test Cells

| Test Cell | X offset (nm) | X mag (ppm) | Mag (ppm) |
|---|---|---|---|
| B' | 25 | −2 | 2 |
| A' | 25 | 2 | −2 |
| D | −25 | −1 | 1 |
| C | −25 | 1 | −1 |
| POR | 0 | 0 | 0 |
| A | 25 | 1 | −1 |
| B | 25 | −1 | 1 |
| C' | −25 | 2 | −2 |
| D' | −25 | −2 | 2 |

For each of the nine test cells described above, the overlay error within the test cell product field was measured at twelve predetermined measurement sites across the exposure slit. Plots of this data as a function of field position across the slit are shown in FIGS. 4A and 4B.

A Scanning Electron Microscope (SEM) was used to view the product overlay registration for Level 2 aligned to Level 1. In order to view this overlay registration, the registration measurements were performed post Level 2 etch. After etching the Level 2 pattern, the underlying Level 1 features were clearly visible along with the Level 2 pattern.

The product overlay measurements were taken by hand from SEM photomicrographs using a scale. The collection of these measurements could be automated by developing an SEM program, with the added advantage of higher measurement resolution.

Figure 4A:
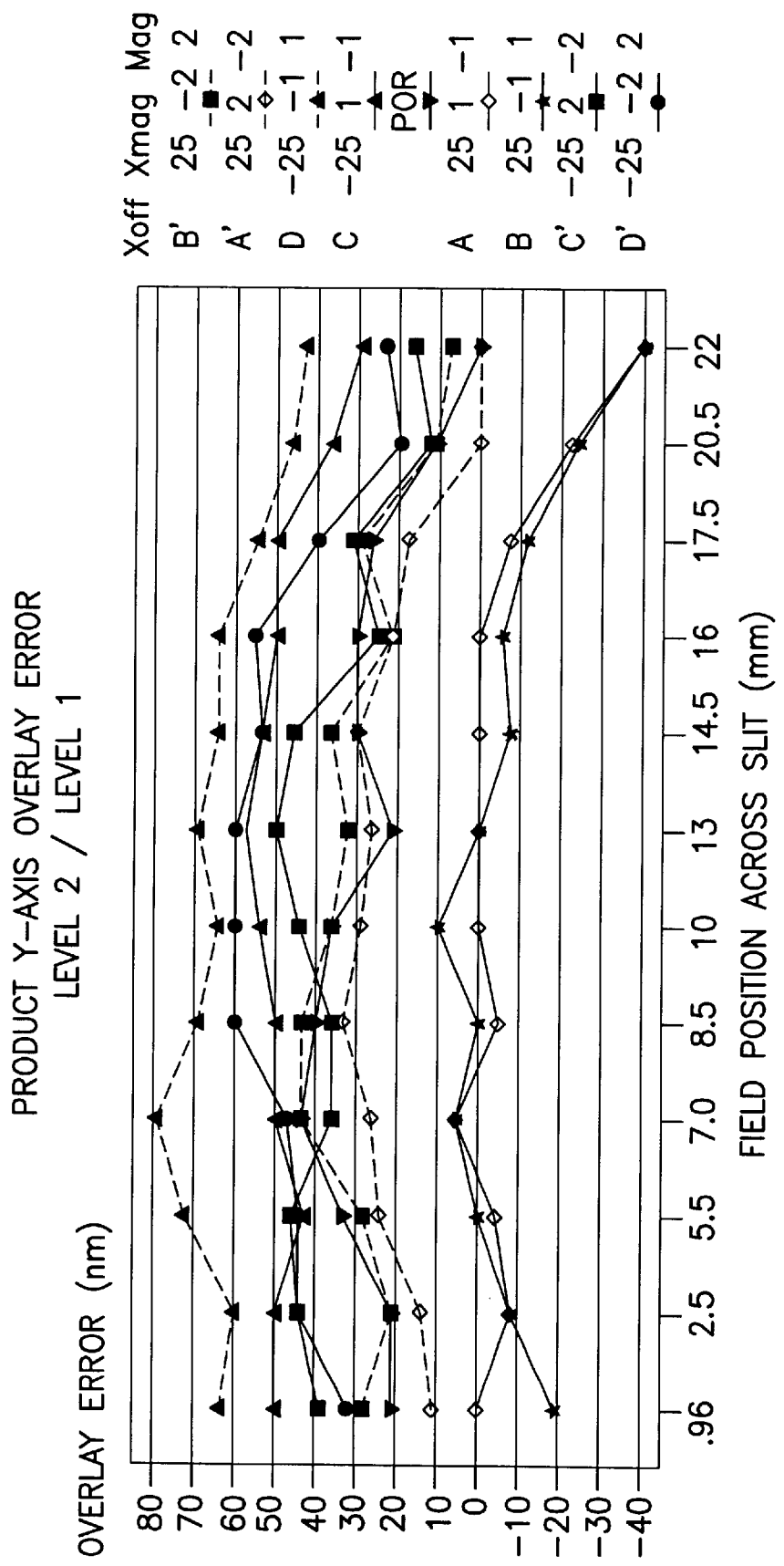
FIG. 4A is a graph of y-axis overlay error as a function of field position across the exposure slit, measured in the nine test cells of the test wafer of FIG. 3.
Figure 4B:
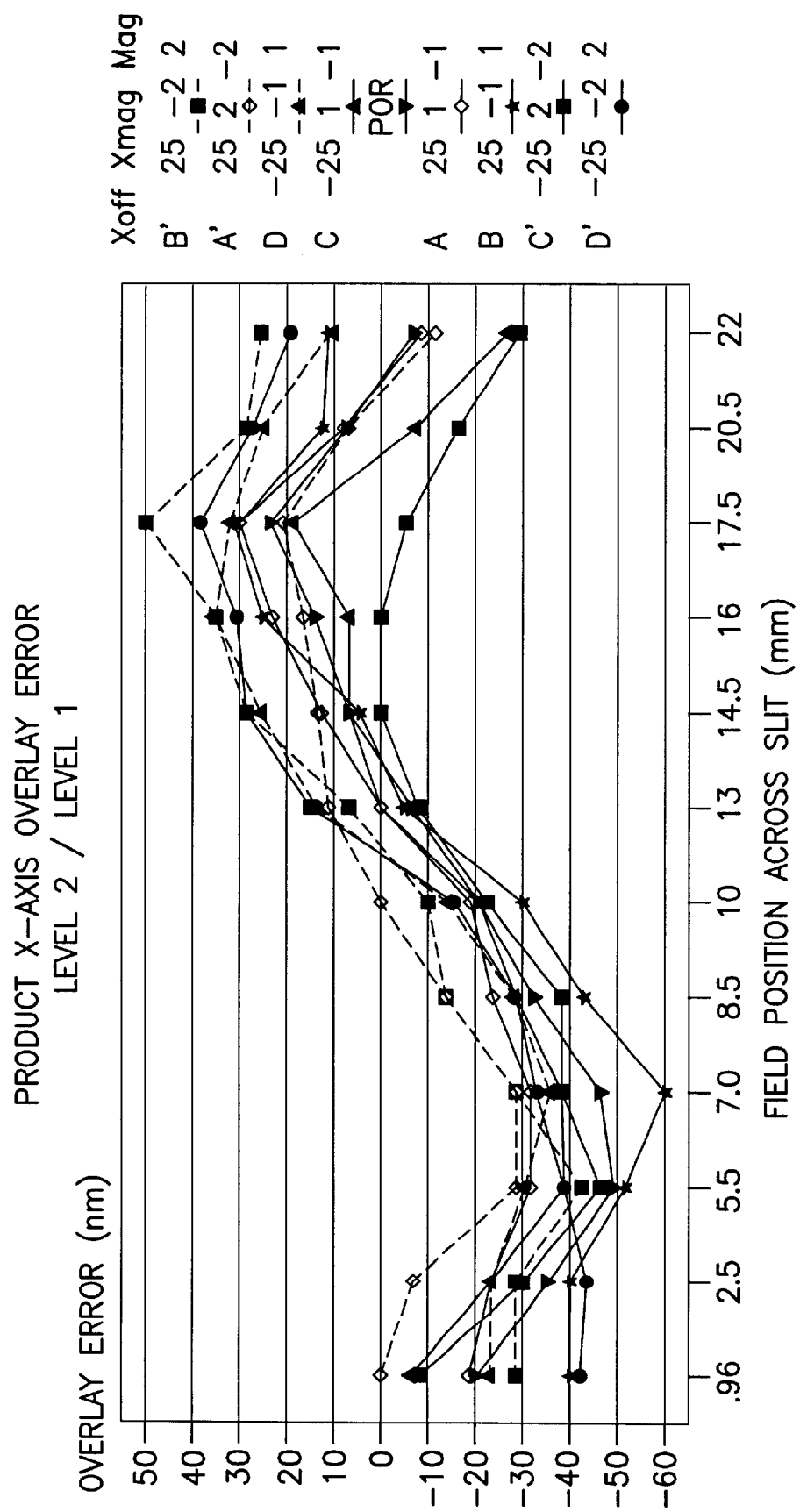
FIG. 4B is a graph of x-axis overlay error as a function of field position across the exposure slit, measured in the nine test cells of the test wafer of FIG. 3.

FIG. 4A shows plots of the y-axis overlay error as a function of field position across the slit for each of the nine test cells. FIG. 4A demonstrates that the shape of the y-axis overlay error curve for POR does not change significantly when the scanner overlay parameters are changed during exposure.

FIG. 4B shows similar plots of the x-axis overlay error as a function of field position across the slit for the same nine test cells. In FIG. 4B, the x-axis overlay error curves have a sinusoid shape similar to that of curve (a) in FIG. 2B. Therefore, the x-axis overlay error data for the test wafer and the tool self metrology data are consistent.

It was also observed that the nine overlay error curves shown in FIG. 4B vary in the range of the registration error, with the curve for Test Cell A' having the smallest registration error range. Therefore, it was concluded that the x-axis overlay error curve can be successfully modulated by changing the exposure tool overlay settings.

EXAMPLE 3

In this experiment, nonzero box-in-box overlay target values were determined based on the modulated x-axis overlay error curves obtained in Example 2.

As previously stated, among the nine x-axis overlay error curves shown in FIG. 4B, the overlay error curve for Test Cell A' had the smallest range in registration error. The measured values for within field X coordinate, X overlay error and Y overlay error are listed below in Table 2. The X coordinate value indicates the location of the measurement site across the exposure slit, and the X and Y overlay error values represent a measurement between the center points of the Level 2 feature and the underlying Level 1 feature. As discussed previously, these measurements were taken by hand from SEM photomicrographs of each of the twelve measurement sites across Test Cell A'.

TABLE 2

Overlay Error Measurements for Test Cell A'

| Measurement Site | X coord. (mm) | X overlay error (nm) | Y overlay error (nm) |
|---|---|---|---|
| 1 | 0.96 | 0.00 | 11.00 |
| 2 | 2.46 | −7.00 | 13.00 |
| 3 | 5.50 | −29.00 | 24.00 |
| 4 | 6.90 | −29.00 | 26.00 |
| 5 | 8.50 | −14.00 | 33.00 |
| 6 | 10.00 | 0.00 | 29.00 |
| 7 | 13.00 | 11.00 | 26.00 |
| 8 | 14.50 | 14.00 | 29.00 |
| 9 | 16.00 | 17.00 | 21.00 |
| 10 | 17.50 | 21.00 | 17.00 |
| 11 | 20.50 | 7.00 | 0.00 |
| 12 | 22.00 | −11.00 | 0.00 |

From the X and Y overlay error points listed in Table 2, values for product X translation and product Y translation were calculated. Product X translation was estimated to be the average of the twelve measured X overlay error values, and was calculated as −1.67 nm. Product Y translation was estimated to be the average of the twelve measured Y overlay error values, and was calculated as +19.08 nm.

A product X magnification (X mag) was also estimated from the Test Cell A' overlay error data as follows. A simulation routine was performed on the x-axis overlay error data for Test Cell A' in order to identify an X mag value which resulted in the minimum range of X overlay error values. This simulation routine applied a series of X mag values to each of the twelve measurement points on the registration signature curve. The equation used for calculating the simulated X error values at each measurement position was as follows:

$$\text{simulated X error at i}=\text{measured X overlay error at i (nm)}+\text{X mag (ppm)}\times(\text{X coord. at i (mm)}-11\text{ mm})$$

where i is the measurement position. For example, for Measurement Site 3, having an X coordinate of 5.50 mm and an X overlay error of −29.00 nm, applying an X mag value of −2.20 ppm resulted in the following simulated X error value:

$$\text{simulated X error at 3}=-29.00\text{ nm}+-2.20\text{ ppm}\times(5.50\text{ mm}-11\text{ mm})=-16.9\text{ nm}$$

An adjustment of 11 mm to the X coordinate value is applied because the product field was 22 mm across in this experiment. By subtracting 11 mm from the left side of the field, an x-axis is created with the center of the field at 0 mm, negative x values to the left and positive x values to the right. Thus, all corrections are with reference to the center of the field at x=0 mm.

Multiple X mag values were applied, in the manner described above, to the Test Cell A' overlay error data to create several corresponding series of simulated X error values. These values are listed in Table 3 below. The X mag values to be applied were chosen to represent a range above and below the initial X mag value of −2 ppm for Test Cell A'. After the simulated X error values were calculated for each input X mag value, the maximum and minimum simulated X error values were identified, and the range in X error was calculated for each input X mag value. It was observed that the minimum range for X error occurred when input X mag was approximately −1.10 ppm.

Figure 5:
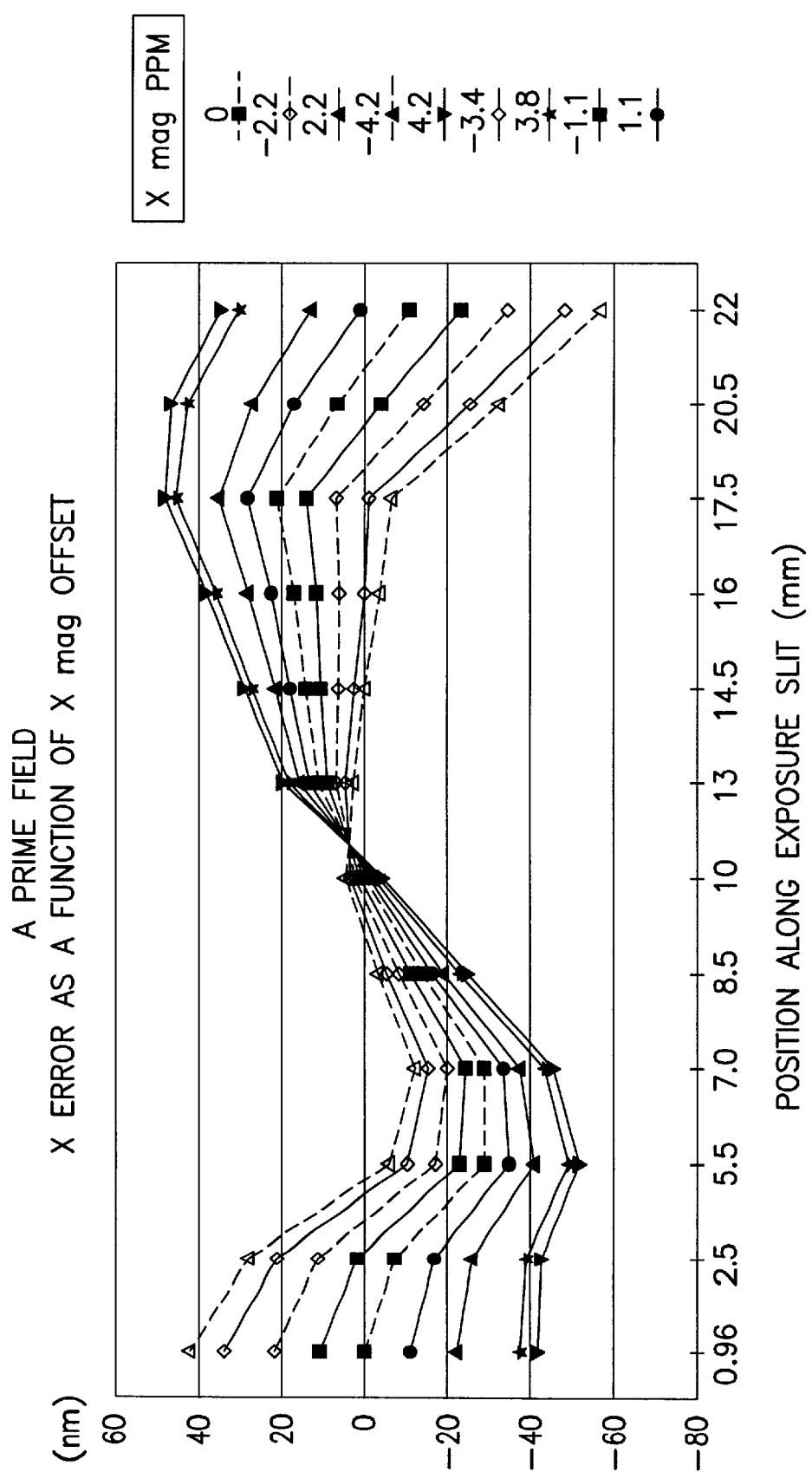
FIG. 5 is a graph of x-axis overlay error as a function of field position across the exposure slit for one of the nine test cells of FIG. 3, where the X mag factor has been varied to generate a family of simulated overlay error curves.

FIG. 5 shows plots of the simulated X error data for each of the applied X mag values. It can be seen from FIG. 5 that an X mag value of approximately −1.10 ppm resulted in a curve having the minimum range of X error.

Product Y magnification (Y mag) was assumed to be negligible. As discussed previously in Example 2, the range in the y-axis overlay error curves in FIG. 4A did not change significantly when the scanner overlay parameters were changed during exposure. Therefore, changes in y translation only are needed to center the product overlay error in the y direction about zero.

TABLE 3

Simulated X Error Values for Test Cell A'

Applied X mag value (ppm)

| Position | 0.00 | −2.20 | 2.20 | −4.20 | 4.20 | −3.40 | 3.80 | −1.10 | 1.10 |
|---|---|---|---|---|---|---|---|---|---|
| | | | | Simulated X error (nm) | | | | | |
| 1 | 0.00 | 22.09 | −22.09 | 42.17 | −42.17 | 34.14 | −38.15 | 11.04 | −11.04 |
| 2 | −7.00 | 11.70 | −25.70 | 28.70 | −42.70 | 21.90 | −39.30 | 2.35 | −16.35 |
| 3 | −29.00 | −16.90 | −41.10 | −5.90 | −52.10 | −10.30 | −49.90 | −22.95 | −35.05 |
| 4 | −29.00 | −20.20 | −37.80 | −12.20 | −45.80 | −15.40 | −44.20 | −24.60 | −33.40 |
| 5 | −14.00 | −8.50 | −19.50 | −3.50 | −24.50 | −5.50 | −23.50 | −11.25 | −16.75 |
| 6 | 0.00 | 2.20 | −2.20 | 4.20 | −4.20 | 3.40 | −3.80 | 1.10 | −1.10 |
| 7 | 11.00 | 6.60 | 15.40 | 2.60 | 19.40 | 4.20 | 18.60 | 8.80 | 13.20 |
| 8 | 14.00 | 6.30 | 21.70 | −0.70 | 28.70 | 2.10 | 27.30 | 10.15 | 17.85 |
| 9 | 17.00 | 6.00 | 28.00 | −4.00 | 38.00 | 0.00 | 36.00 | 11.50 | 22.50 |
| 10 | 21.00 | 6.70 | 35.30 | −6.30 | 48.30 | −1.10 | 45.70 | 13.85 | 28.15 |
| 11 | 7.00 | −13.90 | 27.90 | −32.90 | 46.90 | −25.30 | 43.10 | −3.45 | 17.45 |
| 12 | −11.00 | −35.20 | 13.20 | −57.20 | 35.20 | 8.40 | 30.80 | −23.10 | 1.10 |
| max. | 21.00 | 22.09 | 35.30 | 42.17 | 48.30 | 34.14 | 45.70 | 13.85 | 28.15 |
| min. | −29.00 | −35.20 | −41.10 | −57.20 | −52.10 | −48.40 | −49.90 | −24.60 | −35.05 |
| range | 50.00 | 57.29 | 76.40 | 99.37 | 100.40 | 82.54 | 95.60 | 38.45 | 63.20 |

Thus, for Test Cell A', product X translation, product Y translation and product X mag values were calculated as:

A' product X translation=−1.67 nm

A' product Y translation=+19.08 nm

A' product X mag=−1.10 ppm

Turning now to the box-in-box overlay targets located in the kerf for Test Cell A', the box-in-box coordinates and box-in-box overlay offsets were measured in both the x and y directions. The four box-in-box overlay targets, identified as Target Sites 1–4, are shown schematically in FIG. 1 as box-in-box overlay targets 111–114 respectively. The x and y coordinates indicate the location of the center of the smaller overlay box, and the overlay offsets represent a measurement between the center points of the smaller overlay box and larger underlying box. These coordinate and overlay offset values are listed below in Table 4.

TABLE 4

Box-in-Box Analysis for Test Cell A'

| Box-in-box Target Site | X coord. (mm) | Y coord. (mm) | X offset (nm) | Y offset (nm) |
|---|---|---|---|---|
| 1 | −0.165 | 42.773 | 18.000 | 19.500 |
| 2 | −0.164 | 56.940 | 13.000 | −12.500 |
| 3 | −22.135 | 56.941 | −28.000 | −5.000 |
| 4 | −22.137 | 42.774 | −42.000 | 0.000 |

After measuring the coordinates and offsets for each of the four box-in-box overlay targets, values for box-in-box X translation, box-in-box Y translation, box-in-box X mag (X mag) and box-in-box Y magnification (Y mag) were then calculated.

Box-in-box X translation was estimated to be the average of the four measured box-in-box X overlay offsets, and was calculated as −9.750 nm. Box-in-box Y translation was estimated to be the average of the four measured box-in-box Y overlay offsets, and was calculated as +0.500 nm. The formulas used to estimate box-in-box X mag and box-in-box Y mag are as follows:

$$X\ mag \cong \frac{((Site\ 3\ X\ offset + Site\ 4\ X\ offset) - (Site\ 1\ X\ offset + Site\ 2\ X\ offset))}{((Site\ 3\ X\ coord. + Site\ 4\ X\ coord.) - (Site\ 1\ X\ coord. + Site\ 2\ X\ coord.))}$$

$$Y\ mag \cong \frac{((Site\ 3\ X\ offset + Site\ 4\ X\ offset) - (Site\ 1\ X\ offset + Site\ 2\ X\ offset))}{((Site\ 3\ X\ coord. + Site\ 4\ X\ coord.) - (Site\ 1\ X\ coord. + Site\ 2\ X\ coord.))}$$

Using these formulas, box-in-box X mag was calculated as +2.298 ppm, and box-in-box Y mag was calculated as −1.306 ppm. The units for X mag and Y mag are nm/mm, which can be expressed as ppm.

To summarize, for Test Cell A', product X translation, product Y translation, and product X mag values were calculated as:

A' product X translation=−1.67 nm

A' product Y translation=+19.08 nm

A' product X mag=−1.10 ppm

Next, for Test Cell A', box-in-box X translation, box-in-box Y translation, box-in-box X mag, and box-in-box Y mag were calculated as:

A' box-in-box X translation=−9.750 nm

A' box-in-box Y translation=+0.500 nm

A' box-in-box X mag=+2.298 ppm

A' box-in-box Y mag=−1.306 ppm

These calculations were repeated for each of the remaining eight test cells listed in Table 1. Thus, for each test cell, product X translation and box-in-box X translation values were calculated, resulting in a set of nine data points. Similarly, for each test cell, product Y translation and box-in-box Y translation values were calculated, resulting in another set of nine data points. Finally, for each test cell, product X mag and box-in-box X mag values were calculated, resulting in a third set of nine data points. (Product Y mag was assumed to be negligible for each of the test cells.)

Figure 6A:
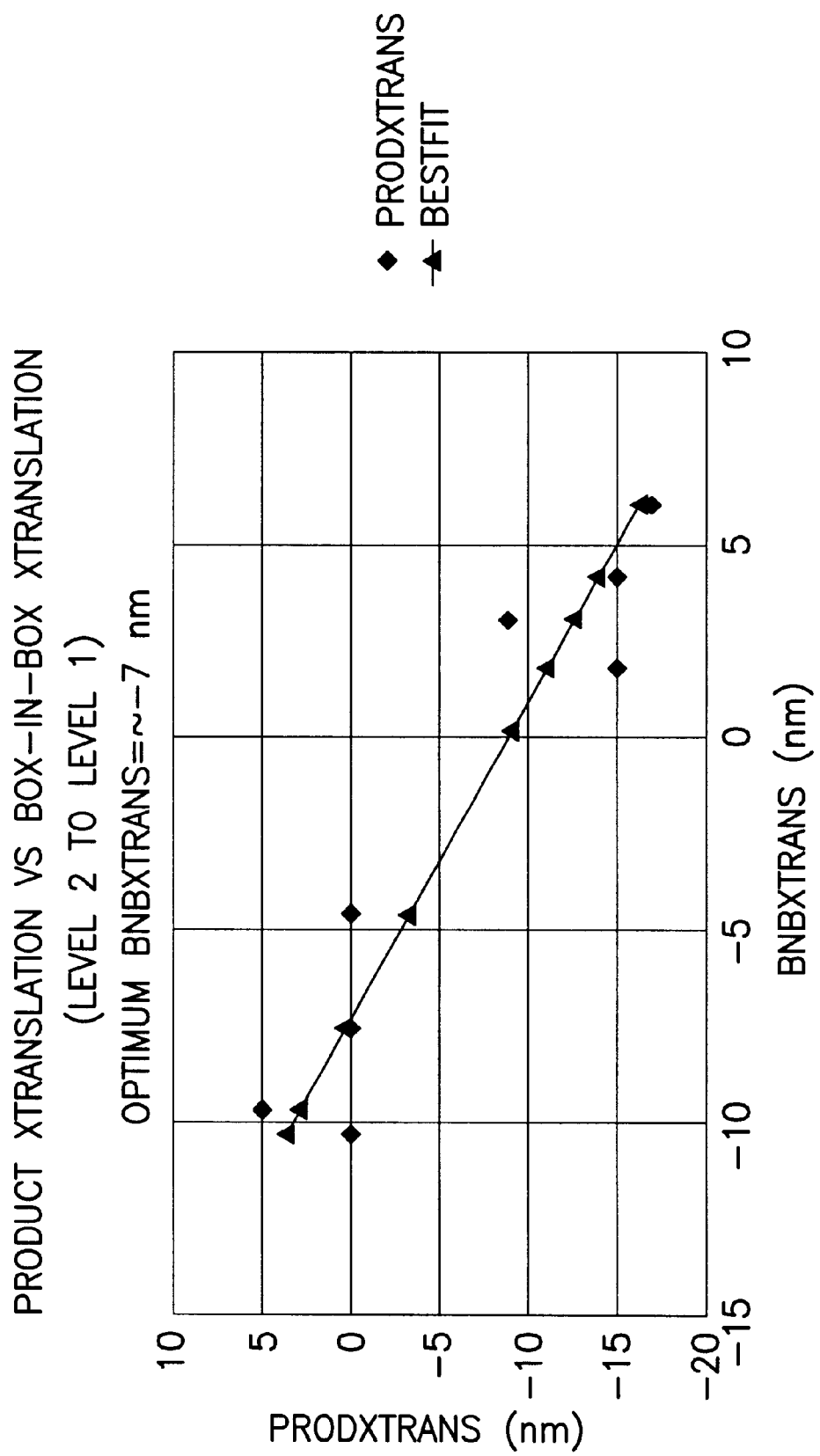
FIG. 6A is a plot of product X translation versus box-in-box X translation, with a least squares regression analysis line drawn through the data points.
Figure 6B:
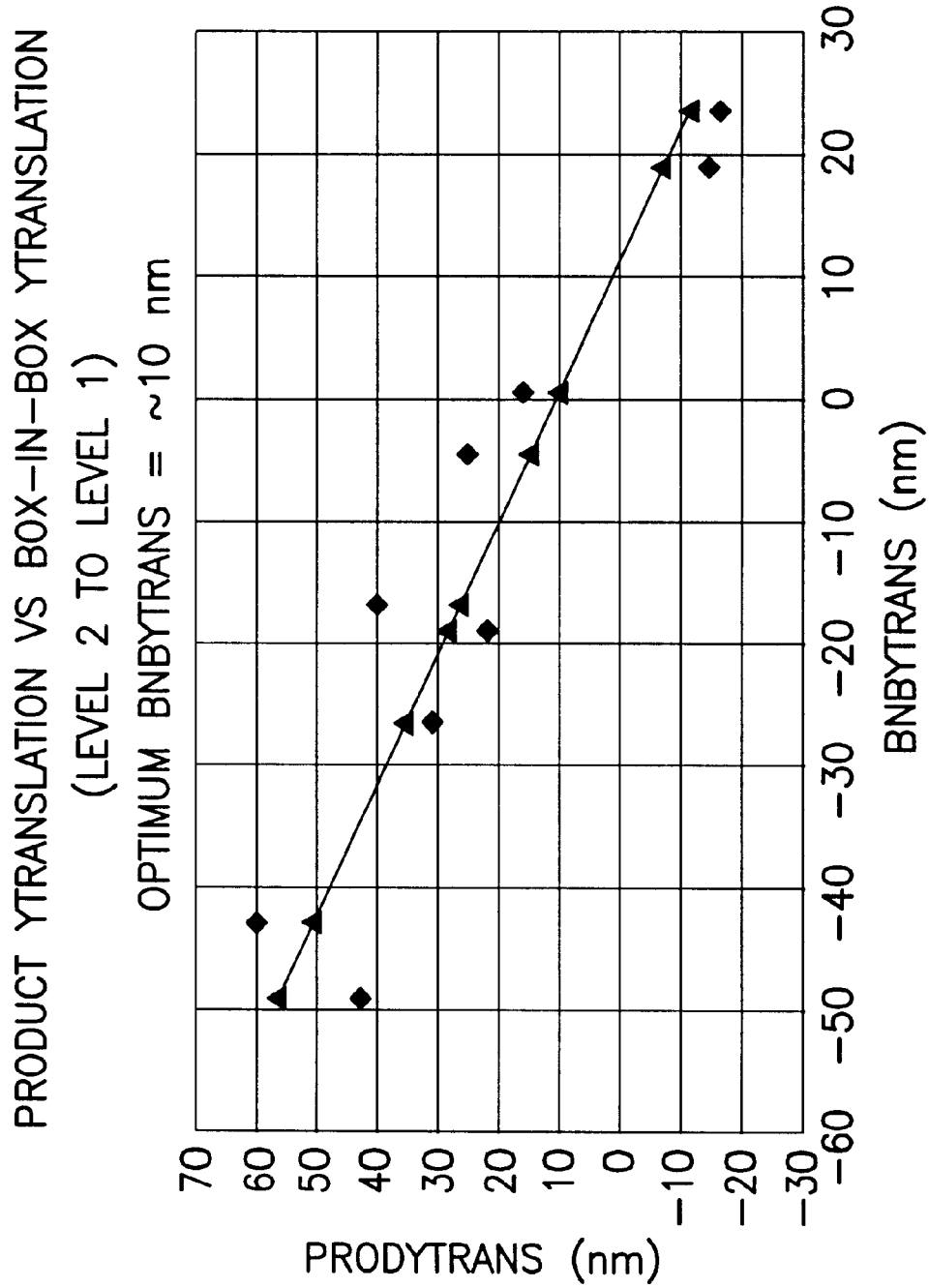
FIG. 6B is a plot of product Y translation versus box-in-box Y translation, with a least squares regression analysis line drawn through the data points.

These three sets of nine data points were plotted in FIGS. 6A–6C in order to determine optimum box-in-box values when the product values are zero. FIG. 6A shows a plot of the nine X translation data points obtained for each test cell. Product X translation ("prodxtrans") and box-in-box X translation ("BNBxtrans") for each test cell were plotted in FIG. 6A, and then a least squares regression was performed on this set of nine data points, resulting in the best fit line shown ("bestfit"). This best fit line indicates that when the product X translation is zero, the box-in-box X translation is approximately −7 nm.

Similarly, FIG. 6B shows a plot of the nine Y translation data points obtained for each test cell. Product Y translation ("prodytrans") and box-in-box Y translation ("BNBytrans") for each test cell were plotted in FIG. 6B, and then a least squares regression was performed on this set of nine data points, resulting in the best fit line shown ("bestfit"). This best fit line indicates that when the product Y translation is zero, the box-in-box X translation is approximately +10 nm.

Finally, FIG. 6C shows a plot of the nine X mag data points obtained for each test cell. Product X mag ("prodxmag") and box-in-box X mag ("BNBxmag") for each test cell were plotted in FIG. 6C, and then a least squares regression was performed on this set of nine data points, resulting in the best fit line shown ("bestfit"). This best fit line indicates that when the product X mag is zero, the box-in-box X mag is approximately +3.30 ppm. This value is in agreement with the calculated A' box-in-box X mag and the calculated A' product X mag. As discussed previously, the A' box-in-box X mag was calculated as +2.298 ppm, and the A' product X mag was calculated as −1.10 ppm. Adding 1.10 ppm to the A' product X mag will result in a product X mag of zero, and adding the same 1.10 ppm to the A' box-in-box X mag will result in a box-in-box X mag of approximately 3.30 ppm.

To summarize, the optimum box-in-box X translation, box-in-box Y translation, and box-in-box X mag values were estimated as:

Box-in-box X translation=−7 nm

Box-in-box Y translation=+10 nm

Box-in-box X mag=+3.30 ppm

Box-in-box Y mag≈0 ppm

These values are optimum because the corresponding product values are zero at these box-in box values. The optimum box-in-box Y mag value is approximately zero because the product Y mag values were assumed to be close to zero.

These values for box-in-box X translation, Y translation, X mag and Y mag were then applied to the box-in-box target locations to determine nonzero target locations. The original locations of box-in-box target sites 1–4, when the box-in-box overlay error is zero, are given below in Table 5.

TABLE 5

Box-in-box Target Locations for Zero Overlay Error

| Box-in-box Target Site | X location (mm) | Y location (mm) |
|---|---|---|
| 1 | 10.987 | −7.083 |
| 2 | 10.986 | 7.083 |
| 3 | −10.987 | 7.084 |
| 4 | −10.986 | −7.083 |

The nonzero target overlay values were calculated as follows. The nonzero target X overlay value was determined by multiplying the box-in-box X location times the box-in-box X mag factor, and then adding that to the box-in-box X translation. The nonzero target Y overlay value was determined by multiplying the box-in-box Y location times the box-in-box Y mag factor, and then adding that to the box-in-box Y translation. The formulas for these calculations are as follows:

Nonzero X overlay=(X mag)×(zero X location)+X translation

Nonzero Y overlay=(Y mag)×(zero Y location)+Y translation

For example, the nonzero X overlay for Target Site 1 was calculated as follows:

Nonzero X overlay for Site 1=3.30 ppm×10.987 mm−7 nm=29.3 nm

Similarly, nonzero Y overlay for Target Site 1 was calculated as follows:

Nonzero Y overlay for Site 1=0 ppm×(−7.083 mm)+10 nm=10 nm

Thus, box-in-box Target Site 1 should be offset by 29.3 nm in the x direction and 10 nm in the y direction. Similar calculations were performed for nonzero X and Y overlay values for the remaining three target sites, and the results are listed in Table 6 below.

TABLE 6

Nonzero Box-in-box Target Overlay Values

| Box-in-box Target Site | X Overlay (nm) | Y Overlay (nm) |
|---|---|---|
| 1 | 29.3 | 10 |
| 2 | 29.3 | 10 |
| 3 | −43.3 | 10 |
| 4 | −43.3 | 10 |

The calculations performed in this example were simplified, approximate calculations A more robust calculation routine could be used involving simultaneous solution of multiple equations to determine more exact values for nonzero box-in-box target overlays.

After obtaining nonzero box-in-box target overlay values, the overlay model was changed to accommodate these nonzero targets. The overlay model is used to calculate the alignment correction that should be applied to the scanner tool. These nonzero targets were used by the overlay model in place of the conventional box-in-box zero reference target points. The overlay model then calculated all overlay corrections based upon the nonzero reference targets. Overlay corrections sent to the scanner were such that the box-in-box targets were driven to the nonzero overlay targets.

Figures 1, 7A:
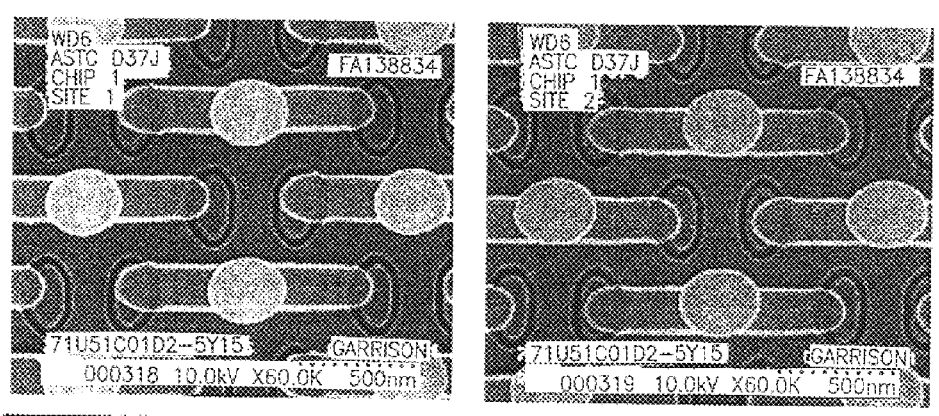
FIG. 7A is a series of SEM photomicrographs taken within Field 1 of a product wafer, after adjustment factors were applied to the box-in-box overlay targets.
Figures 2, 7A:
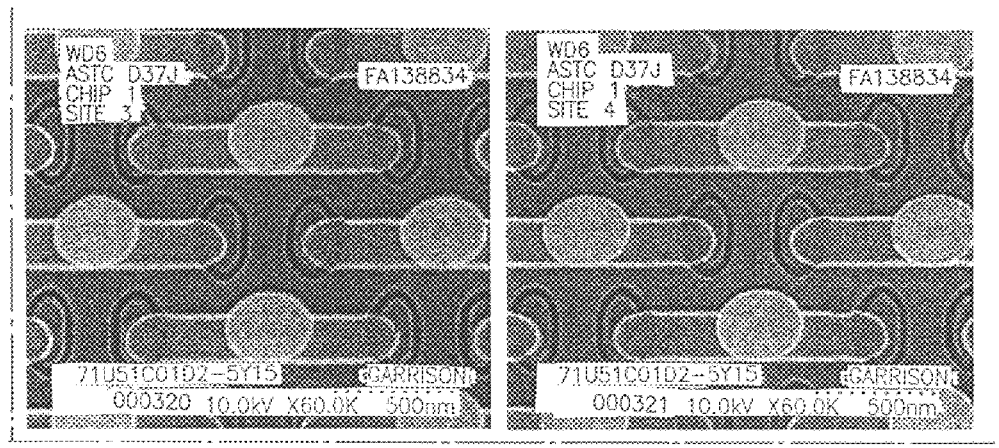
Figures 3, 7A:
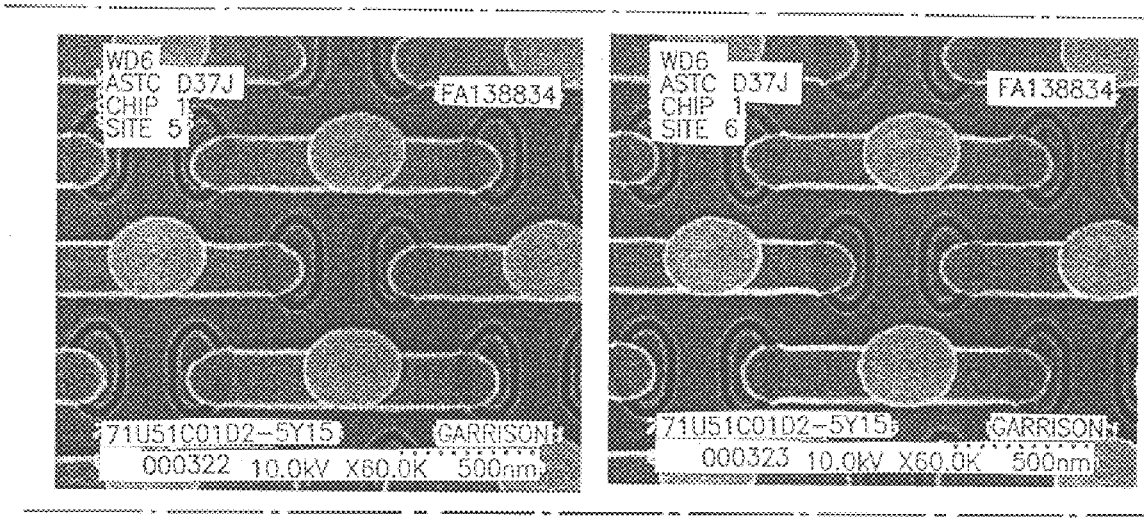
Figures 4, 7A:
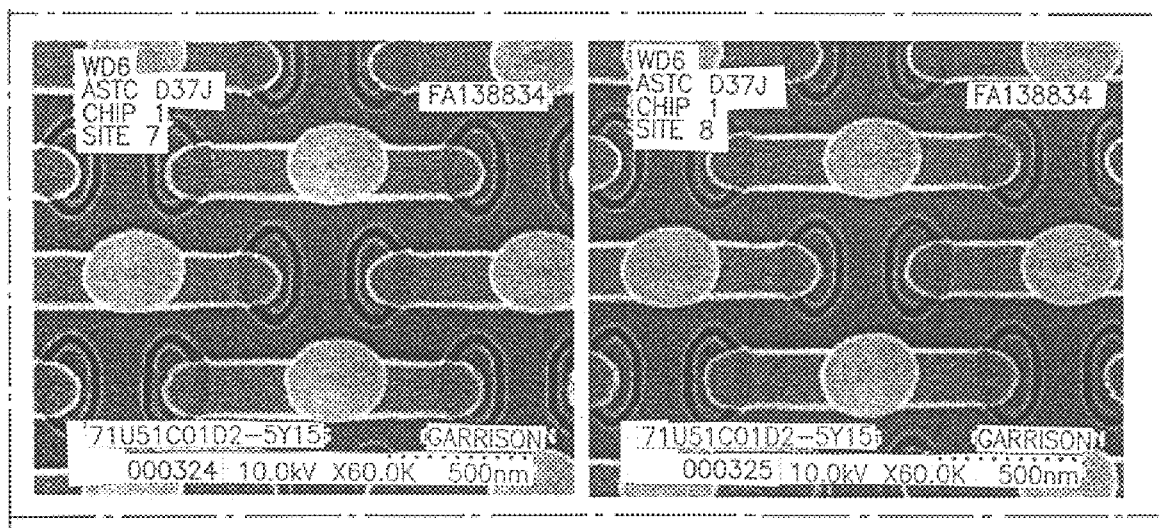
Figures 5, 7A:
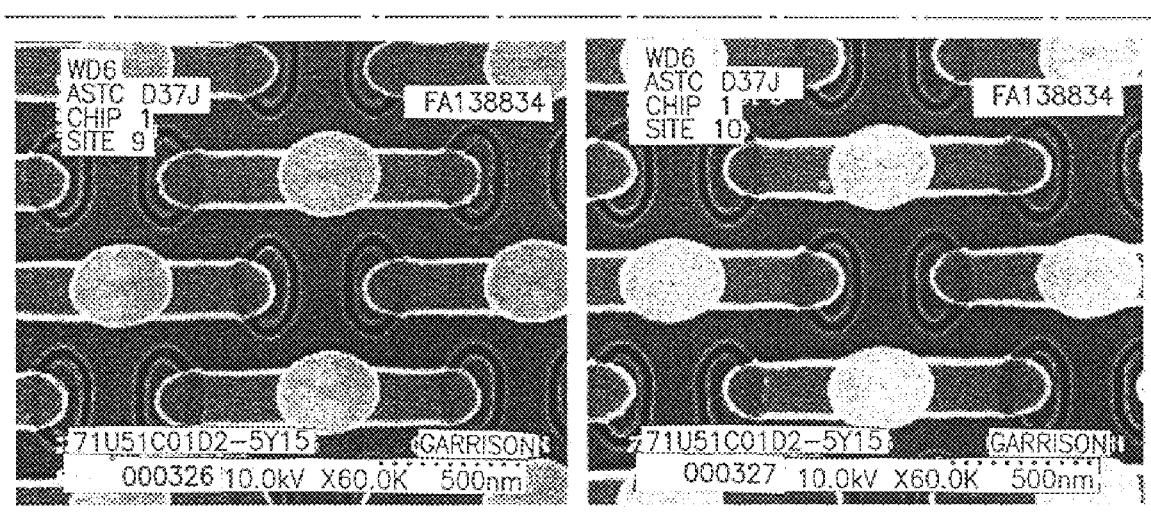
Figures 6, 7A:
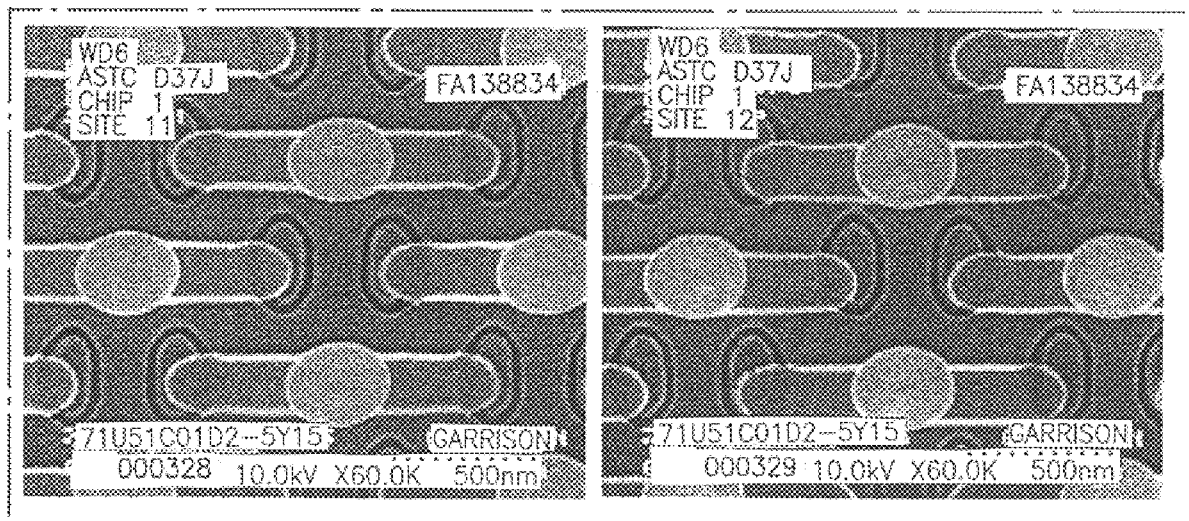
Figures 1, 7B:
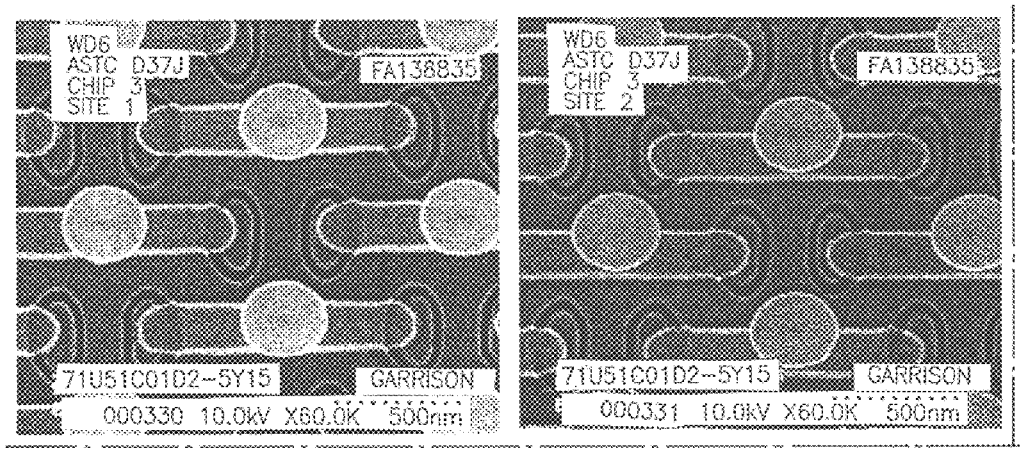
FIG. 7B is a series of SEM photomicrographs taken within Field 3 of a product wafer, after adjustment factors were applied to the box-in-box overlay targets.
Figures 2, 7B:
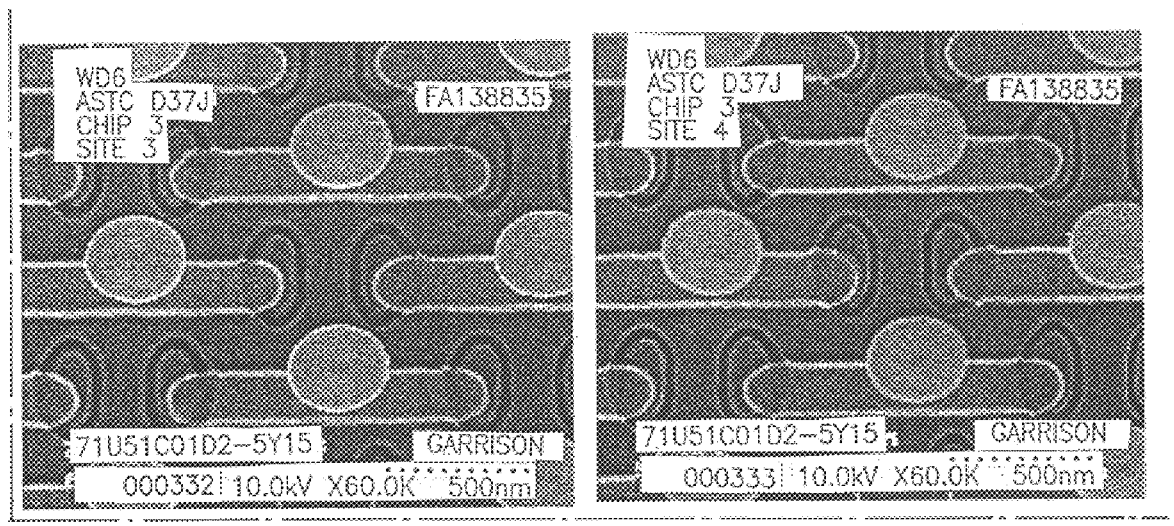
Figures 3, 7B:
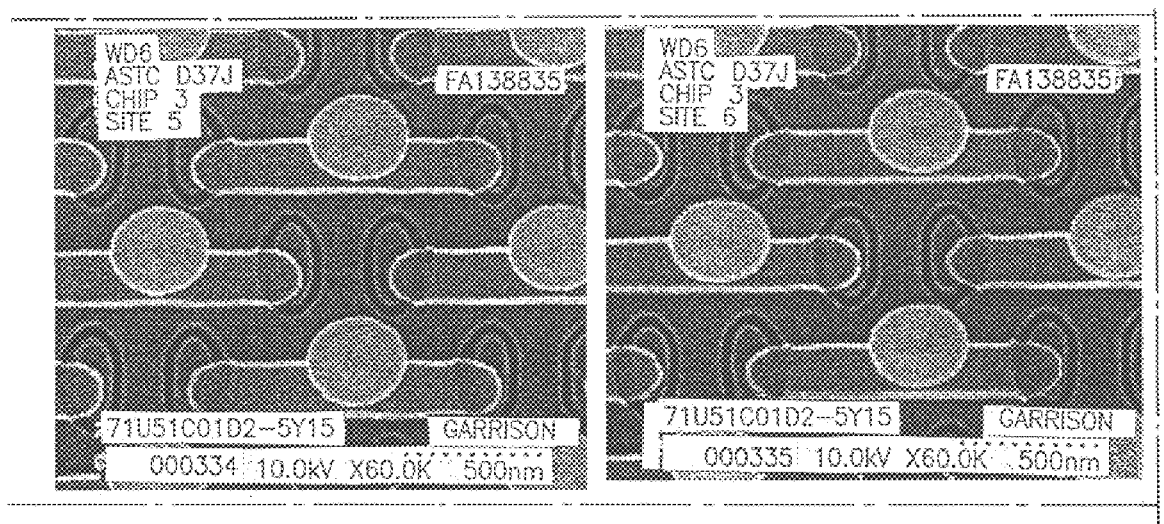
Figures 4, 7B:
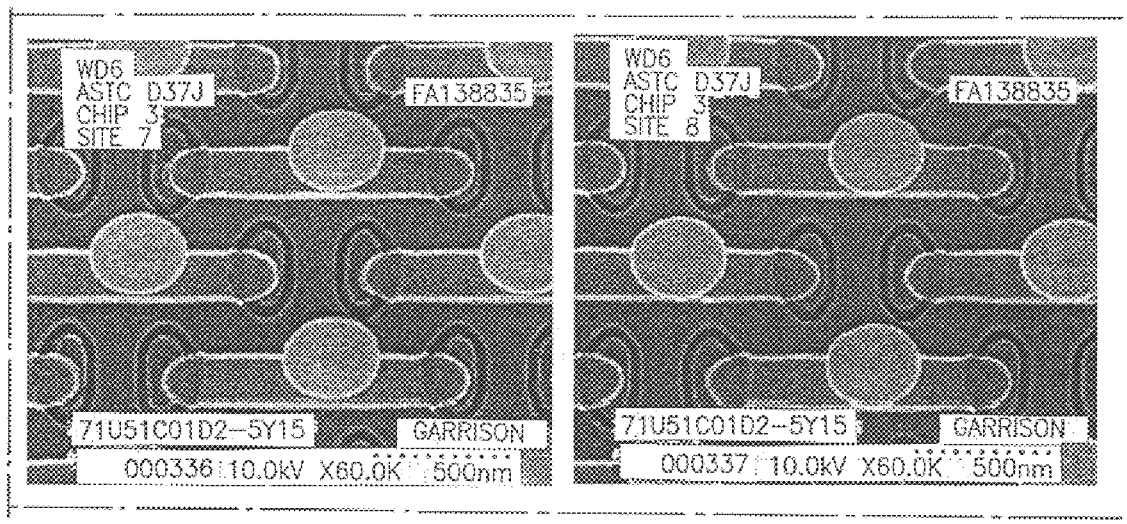
Figures 5, 7B:
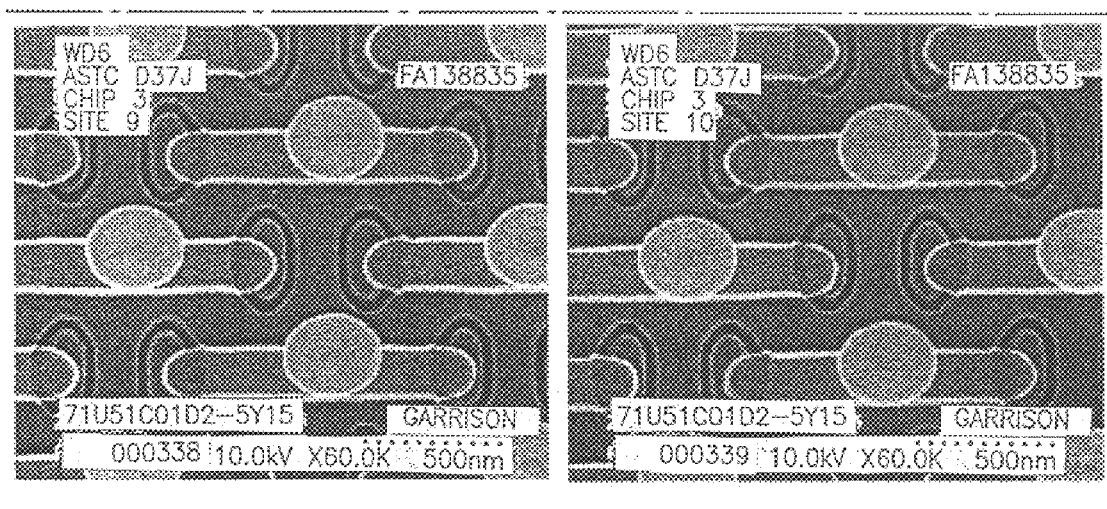
Figures 6, 7B:
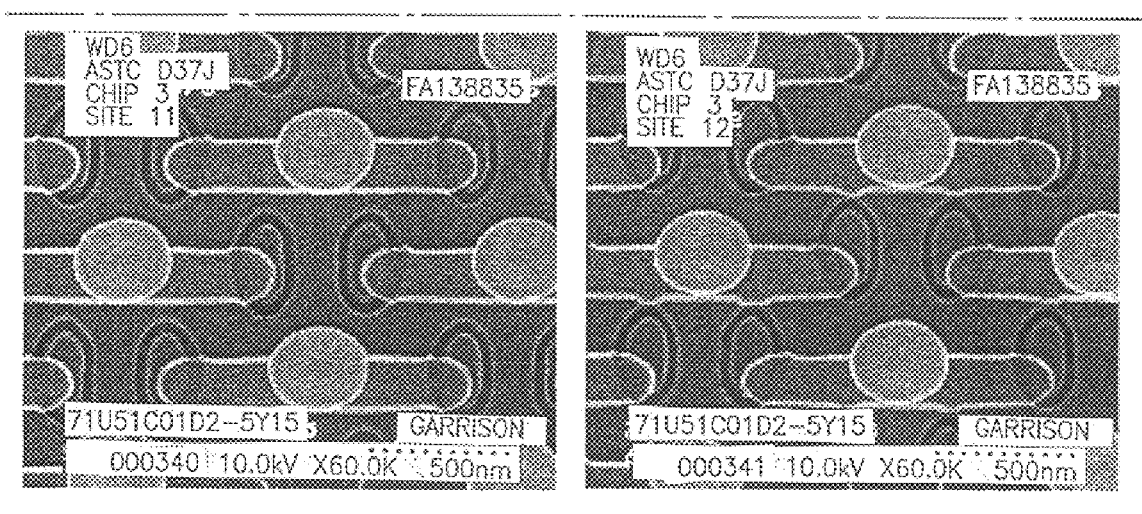

FIGS. 7A and 7B show SEM photomicrographs of actual product fields on a semiconductor wafer after these nonzero overlay values were entered into the Micrascan III Step and Scan tool. Each figure shows a series of twelve photomicrographs corresponding to the twelve measurement sites across the exposure slit. In FIG. 7A, these twelve measurement sites were located in a portion of the product wafer designated as Field 1. In FIG. 7B, the twelve measurement sites were located in Field 3.

Within each photomicrograph, several device features located on three levels can be seen. The lowest layer is Level 1, and the Level 1 features are the smaller oval features having a dark outline. The next layer is Level 2, and the Level 2 features are the longer oblong features spanning two Level 1 features. The top layer is Level 3, and the Level 3 features are the circular features centered above the Level 2 features. Level 1 was exposed using Tool A before lens element change; Level 2 was exposed using Tool A after lens element change, and Level 3 was exposed using Tool B.

It can be seen from these photomicrographs that the position of the Level 2 feature, relative to each corresponding pair of Level 1 features, shifts slightly across the twelve measurement sites. This shift is consistent with the previously observed sinusoidal shape of the overlay error curve. However, the Level 2 to Level 1 shift or overlay error has been minimized such that the overlay error at each measurement site is well within the total overlay error budget.

While the present invention has been particularly described in conjunction with a preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method for aligning a projected image of a photolithography mask pattern for a second product layer with respect to a first product layer, wherein the first product layer includes a periphery surrounding a first product area, the mask pattern for the second product layer includes a periphery surrounding a second product area, the first product area includes at least one first product feature, the second product area includes at least one second product feature, the periphery surrounding the first product area includes at least one first reference feature, and the periphery surrounding the second product area includes at least one second reference feature, the method comprising the steps of:

measuring a first overlay error between the at last one first reference feature and the projected image of the at least one second reference feature;

measuring a second overlay error between the at least one first product feature and the projected image of the at least one second product feature;

determining at least one adjustment factor to be applied to the first overlay error between said reference features, such that said adjustment factor minimizes the second overlay error between said product features; and applying said at least one adjustnent factor to the first overlay error between said reference features.

2. The method of claim 1, wherein said adjustment factor is the negative of the overlay error between said product features.

3. The method of claim 1, wherein a plurality of overlay errors between said product features is measured, and said adjustment factor is the negative of the average of the plurality of overlay errors.

4. The method of claim 1, wherein said adjustment factor is an optimum predetermined offset, and said determining step comprises the steps of:

applying a plurality of predetermined offsets to the overlay error between said reference features;

measuring a plurality of overlay errors between said product features, wherein each overlay error between said product features corresponds to one of said plurality of predetermined offsets; and selecting the optimum predetermined offset which results in the minimum overlay error between said product features.

5. The method of claim 4, wherein the step of selecting the optimum predetermined offset comprises performing a least squares regression of a data set consisting of the plurality of overlay errors and the plurality of predetermined offsets.

6. The method of claim 1, wherein said reference features are box-in-box overlay targets.

7. The method of claim 1, wherein said product features are microelectronic device features.

8. The method of claim 1, wherein said overlay error between said reference features comprises a translation error, and said overlay error between said product features comprises a translation error.

9. The method of claim 1, wherein said overlay error between said reference features comprises a magnification error, and said overlay error between said product features comprises a magnification error.

10. The method of claim 1, wherein said overlay error between said reference features comprises a rotation error, and said overlay error between said product features comprises a rotation error.

11. The method of claim 1, wherein said overlay error between said reference features comprises a skew error, and said overlay error between said product features comprises a skew error.

12. The method of claim 1, wherein said overlay error between said reference features comprises a translation error, and said overlay error between said product features comprises a magnification error.

13. The method of claim 1, wherein said overlay error between said reference features comprises a magnification error, and said overlay error between said product features comprises a translation error.

14. The method of claim 1, wherein said overlay error between said reference features comprises a translation error, a magnification error, a rotation error and a skew error, and said overlay error between said product features comprises a translation error, a magnification error, a rotation error and a skew error.

* * * * *